United States Patent [19]

Brundage

[11] 4,432,033

[45] Feb. 14, 1984

[54] POWER SOURCE FOR A SOLENOID CONTROLLED FLUID PRESSURE DEVICE

[76] Inventor: Robert W. Brundage, 135 Paradise Rd., Painesville, Ohio 44077

[21] Appl. No.: 394,266

[22] Filed: Jul. 1, 1982

[51] Int. Cl.³ ............................................ H01H 47/32
[52] U.S. Cl. .................................... 361/152; 318/681; 361/210
[58] Field of Search ............... 361/152, 154, 203, 208, 361/210; 318/631, 681, 677, 678

[56] References Cited

U.S. PATENT DOCUMENTS

| | | |
|---|---|---|
| 1,548,232 | 8/1925 | West Brook . |
| 1,623,431 | 4/1927 | McVoy . |
| 2,615,466 | 10/1952 | Garde . |
| 2,649,688 | 8/1953 | Slomer . |
| 2,650,609 | 9/1953 | Herbst . |
| 2,668,556 | 2/1954 | Meyer . |
| 2,788,800 | 4/1957 | Towler . |
| 2,813,519 | 11/1957 | Persson . |
| 2,898,936 | 8/1959 | Collins . |
| 2,930,360 | 3/1960 | Yando . |
| 2,944,564 | 7/1960 | Pettey . |
| 2,959,156 | 11/1960 | Dreptin . |
| 2,977,984 | 4/1961 | Slomer . |
| 3,017,897 | 1/1962 | Seguenot . |
| 3,131,608 | 5/1964 | Yando . |
| 3,266,378 | 8/1966 | Shaw ............................. 361/154 X |
| 3,279,743 | 10/1966 | De La Garza . |
| 3,308,307 | 3/1967 | Moritz ............................. 318/681 X |
| 3,613,717 | 10/1971 | Smith . |
| 3,686,557 | 8/1972 | Futamura ....................... 318/681 X |
| 3,709,257 | 1/1973 | Faisandier . |
| 3,800,663 | 4/1974 | Clark . |
| 3,842,857 | 10/1974 | McCormack . |
| 3,870,931 | 3/1975 | Myers ............................. 361/210 X |
| 3,902,402 | 9/1975 | Walters . |
| 4,074,699 | 2/1978 | Stampfli . |
| 4,106,522 | 8/1978 | Manesse . |
| 4,150,695 | 4/1979 | Kosugul . |
| 4,158,162 | 6/1979 | Hawkins ......................... 318/681 X |
| 4,161,678 | 7/1979 | Kaieda et al. .................. 318/681 X |

FOREIGN PATENT DOCUMENTS

| | | |
|---|---|---|
| 1048601 | 12/1953 | France . |
| 616361 | 2/1961 | Italy . |
| 860665 | 2/1961 | United Kingdom . |

OTHER PUBLICATIONS

American Barmag, Charlotte, N. Carolina-Electrically Control Directional Flow Valve.
Fluid Controls, Inc., Mentor, OH-Solenoid Cartridge Valve, 1977 Catalog, pp. 20.01 to 21.02.
3 Pages-Fluid Pressure Mechanisms by H. G. Conway, (2nd Div.), pp. 191, 195 & 196.

Primary Examiner—Harry E. Moose, Jr.
Attorney, Agent, or Firm—Body, Vickers & Daniels

[57] ABSTRACT

A power source for a pair of solenoid coils selectively acting in opposite directions on a single armature. The source includes a selectively variable D.C. power source selectively energizing either coil with opposite magnetic polarity and a dither signal generator which continuously supplies out of phase dither signals to the two coils.

7 Claims, 5 Drawing Figures

POWER SOURCE FOR A SOLENOID CONTROLLED FLUID PRESSURE DEVICE

BACKGROUND OF THE INVENTION

This invention pertains to the art of electrical solenoids and more particularly to a power supply for selectively energizing one of a pair of solenoids.

The invention is particularly applicable to energizing a pair of solenoids of a fluid pressure energized electrically controlled actuator or valve of the type described in my co-pending U.S. patent application, Ser. No. 205,214 Filed Nov. 12, 1980, the disclosure of which is incorporated herein by reference, and will be described with particular reference thereto, although it will be appreciated that the invention is equally applicable to any device employing a pair of solenoid coils which must be energized from a variable voltage D-C power source.

BACKGROUND

In my said co-pending U.S. patent application, there is described, particularly in FIGS. 5 and 6, a fluid pressure energized device, including a magnetically permeable armature moveable to cause fluid pressure to vary on a piston member and cause the piston to move as a slave to the position of the armature member, the armature member being moved in either of two directions against the bias of springs by selectively varying the D.C. energizing signal of one of a pair of solenoid coils acting on the armature. The armature moves in proportion to the amount of energizing voltage.

In such devices, one of the problems has been internal friction against the movement of the armature when the energization of one of the solenoids is varied. The problem is particularly bothersome when the armature is at rest and its movements must be started. When the armature is at rest, friction (hereinafter stiction) is higher than when the armature is moving. This stiction results in the armature remaining stationary while the energization on one of the coils is changed, until the magnetic forces developed exceed the stiction and spring forces at which time the armature suddenly moves to a position dictated by the energization of the coil. Stiction results in what is termed hysteresis and is undesirable in a fluid pressure device of the type to which this invention pertains.

It has been known heretofore in devices having a single solenoid coil to superimpose on the variable D-C voltage supplied to the coil a low frequency A-C voltage, a dither signal, which effectively appears to eliminate the problems of stiction and results in an extremely low hysteresis.

In the course of testing the device of the said application using a pair of solenoid coils, a dither signal was superimposed on the variable voltage applied to each coil. At the higher levels of energization of any one coil, stiction was not a problem. However, at the low levels of energization of either coil, stiction remained an unexplained problem for an experimental period of almost six months.

The present invention contemplates a new and improved arrangement for applying the dither signal to the solenoid coils which overcomes all of the above referred to problems and others and substantially eliminates the hysteresis problems caused by stiction.

In accordance with the invention there is provided for a device having a pair of electrically energized solenoid coils, a power source including means for supplying a variable D-C voltage selectively to one of a pair of solenoid coils and means for superimposing a dither voltage on each of the coils, importantly the dither voltage applied to the two coils being out of phase one with the other.

Thus, at a low energization level of either coil, one coil first receives a dither signal or pulse tending to move the armature in one direction, and then the other coil receives a dither signal or pulse tending to move the armature in the opposite direction, the result being a continually reciprocating magnetic force on the armature over and above the magnetic force created by the variable D-C voltage.

The principle object of the invention is the provision of a new and improved power source for a pair of solenoid coils which is simple in construction and effectively eliminates the problems of stiction and thus hysterisis on an armature moveable under the magnetic forces of solenoids.

Another object of the invention is the provision of a new and improved power source for a pair of solenoid coils wherein variable D-C voltages are applied to a pair of coils, which voltages have a dither signal superimposed thereon and wherein the dither signal as applied to one coil is out of phase with the dither signal applied to the other coil.

The invention may take physical form in certain parts and arrangements of parts, in certain steps and combinations of steps, a preferred embodiment of which will be described in detail in this specification and illustrated in the accompanying drawings which form a part hereof and wherein.

The power source of the present invention is comprised of three major subsystems: A signal generator A shown in FIG. 1; A power supply B shown in FIG. 2; and a dither signal generator C shown in FIG. 3.

Figure 5:
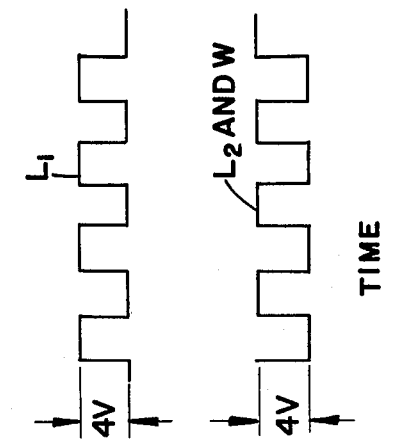
FIG. 5 is a representation of the dither signals superimposed on the voltages of FIG. 4 and applied to coils L1 and L2.
Figure 3:
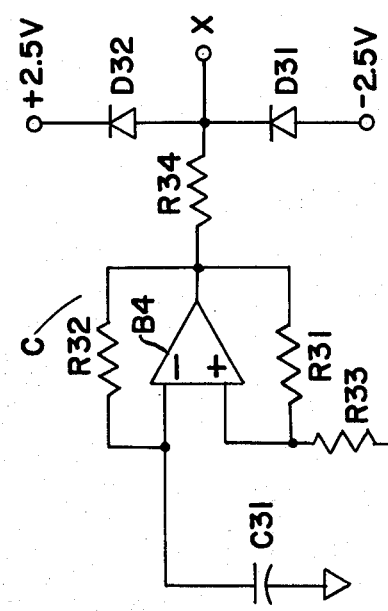
FIG. 3 is a schematic of a dither signal circuit.

The dither signal generator C shown in FIG. 3 provides a dither signal as shown in FIG. 5 at Point X consisting of a square wave signal of approximately 50–100 hertz frequency having a peak to peak variation of four volts. The dither circuit will be briefly described later in this specification.

The power supply illustrated in FIG. 2 supplies a +12 volt level, a +12 protected volt level hereinafter identified as 12'; a reference ground level 4.7 volts above chassis ground; a positive reference level 2.5 volts above reference ground; and, a negative reference level 2.5 volts below reference ground. The power supply circuit is conventional and will not be described in more detail. Only the outputs of the power supply are of importance in discussing the main portion of the circuit.

Figure 1:
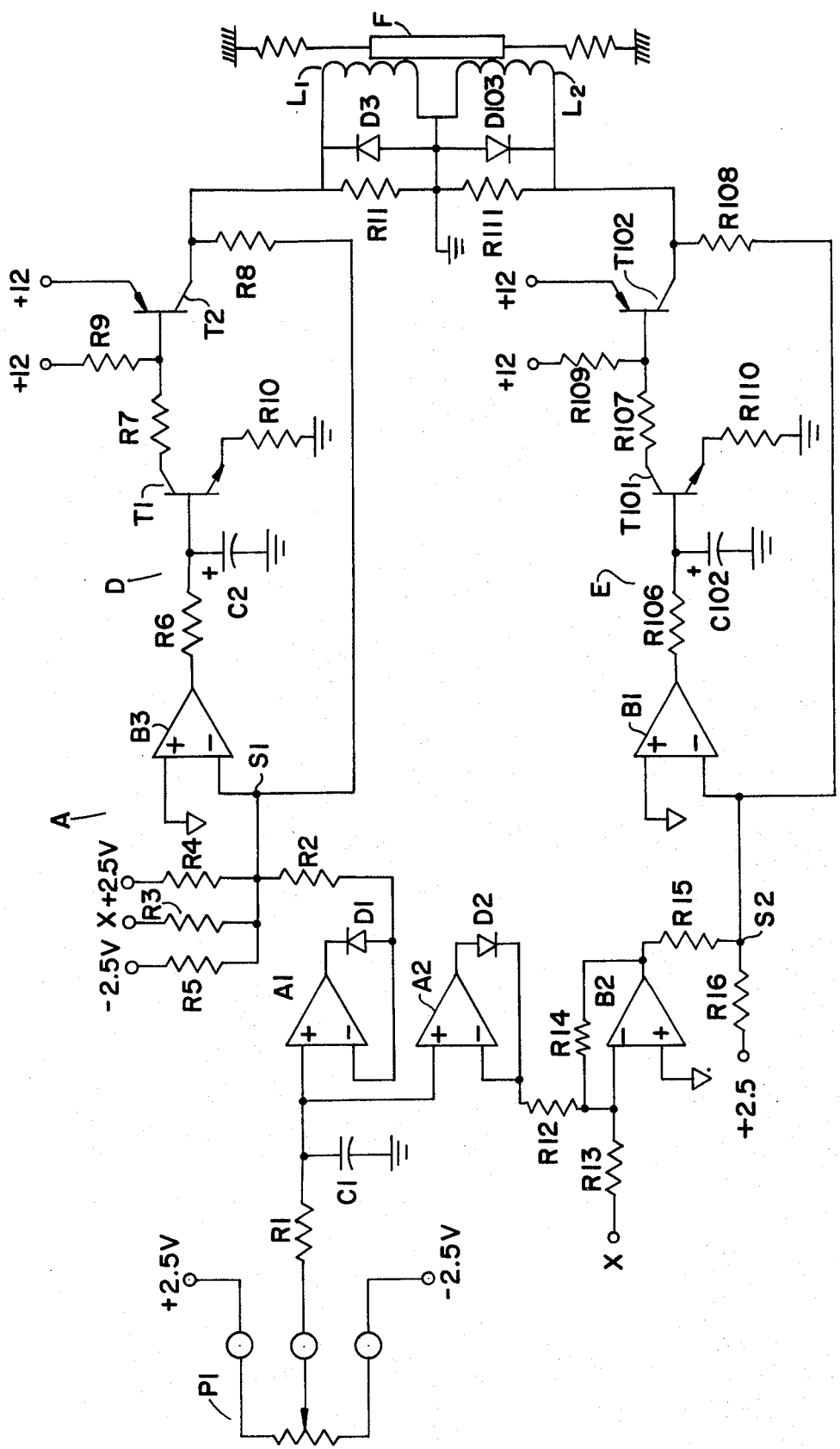
FIG. 1 is a schematic of the control circuit of the preferred embodiment of the invention.

FIG. 1 shows a three terminal potentiometer P1 having its two end terminals connected to the +2.5 reference level and the −2.5 reference level and the wiper terminal connected to the input of operational amplifier A1 through an RC network composed of resistor R1 and capacitor C1. The RC network filters out high frequency noise at the input. This input is applied to the non-inverting input of operational amplifier A1 and will be a voltage level between −2.5 volts and +2.5 volts, referred to the reference ground, depending upon the wiper position. This same signal is applied to the non-inverting input of operational amplifier A2.

The outputs of operational amplifiers A1 and A2 are both connected through a diode to their inverting inputs. Diode D1 has its cathode connected to the output of operational amplifier A1 while diode D2 has its cathode connected to the inverting input of operational amplifier A2. In this configuration, operational amplifier A1 operates as a unity gain buffer passing negative voltage levels only. The output caused by a positive voltage level applied to the non-inverting input of operational amplifier A1 is blocked by diode D1 resulting in a fixed output for all positive voltage levels generated by potentiometer P1.

As diode D2 is connected with opposite polarity with respect to the operational amplifier A2, operational amplifier A2 acts as a unity gain buffer for all positive levels generated by potentiometer P1 while blocking all negative levels. Thus, operational amplifiers A1 and A2 together act as a signal divider which tracks the voltage generated on potentiometer P1 for negative voltages or positive voltages only respectively. When the output of one operational amplifier is tracking P1, the output of the other operational amplifier has a fixed output.

Operational amplifier A1 and A2 also provide an extremely high impedance for potentiometer P1. Because of the high impedance of amplifiers A1, A2, very little current flows in the wiper of potentiometer P1. The current flowing from the two references terminals through the connection lines leading from P1 to the operational amplifier circuits are therefore virtually identical regardless of wiper position. The potential at center point, and therefore the calibration, of potentiometer P1 always is the same with respect to the referenced ground. Further, as so little current need flow to the wiper segment of the circuit, the voltage drop in this long line has little or no effect.

Should it be desired to control the position of a magnetically controllable element with an input device other than a potentiometer, any device capable of varying the voltage level at R1 can be used. This includes digital to analog converters driven by a digital computer.

The output of operational amplifier A1 is applied through resistor R2 to the inverting input of operational amplifier B3. The inverting input of operational amplifier B3 acts as a summing point for the input applied from operational amplifier A1, the dither signal applied from point X through resistor R3, a bias current applied from the +2.5 volt reference source through resistor R4 and an optional additional bias current applied from the −2.5 volts reference level through resistor R5. The bias and input levels are weighted according to the resistance values employed, summed at summing point S1 and applied to the inverting input of operational amplifier B3.

The non-inverting input of operational amplifier B3 is connected to the reference ground. The operational amplifier B3 output is connected through a resistor-capacitor filter network composed of resistor R6 and capacitor C2, to the base of transistor T1 which is in turn connected through resistor R7 to the base of transistor T2. Transistors T1 and T2 act as amplifiers supplying sufficient current to drive solenoid coil L. Resistor R8 is connected as a feedback resistor from the output of transistor T2 to the summing point S1 and hence the inverting input of operational amplifier B3. Operational amplifier B3 and transistors T1 and T2 form a feedback amplifier D the gain of which is dependant on the ratio of feedback resistance to input resistance. The signal applied at summing point S1 is inverted three times, once by each of operational amplifier B3 transistor T1 and transistor T2 resulting in a positive output voltage with respect to the zero reference level at the emitter of transistor T2 in response to a negative value (with respect to ground reference level) at summing point S1.

The output of feedback amplifier D is a signal having a voltage related to the voltage selected at potentiometer P1 with a dither signal imposed thereon 180° out of phase from the original dither signal supplied by the dither signal generator C supplied at point X. This phasing difference is caused by the odd number of inversions in feedback amplifier D.

Resistors R9 and R10 bias transistors T1 and T2. Resistor R11 and Diode D3 provide a discharge path allowing coil L1 to discharge.

The above-described feedback amplifier D provides energization to coil L1 when potentiometer P1 is set to have a negative output voltage. The signal is a constant voltage proportional to the level set at P1 with a dither signal imposed thereon. When the level at potentiometer P1 is positive with respect to the reference ground the above-described feedback amplifier circuit D applies a base voltage level of approximately 3 volts with the dither signal imposed thereon to coil L1.

A positive voltage level at potentiometer P1 activates a second feedback amplifier E through the operational amplifier A2. A positive output on operational amplifier A2 will be applied through resistor R12 to the inverting input of operational amplifier B2. The dither signal is applied from point X of dither circuit through Resistor R13 to the inverting input of operational amplifier B2. Resistor R14 provides a feedback path from the output to the inverting input of operational amplifier B2 is connected to the reference ground. Operational amplifier B2 therefore acts as an inverting amplifier for both the level set at potentiometer P1 and the dither signal with gain determined by the ratio of the feedback resistor R14 to the two input resistors R12 and R13. The output of operational amplifier B2 is a negative voltage with respect to the ground reference inversely proportional to the value set at P1 when the value is a positive value having the dither signal superimposed thereon. As discussed above, during the intervals when the value set by potentiometer P1 is negative, the output of operational amplifier A2 is blocked by diode D2. Operational amplifier B2 will then have a fixed level output with the dither signal inverted and added to this fixed level.

The output signal of operational amplifier B2 is applied through resistor R15 to summing point S2. A bias current is also applied to summing point S2 through resistor R16 from the +2.5 volt reference level. The signals applied to point S2 are weighted according to the values of the resistors R15, R16. The summed voltage is applied to the inverting input of operational amplifier B1 in a manner identical to the application of the signal from summing point S1 to operational amplifier B3 in the first feedback amplifier circuit D. Second feedback amplifier circuit E is identical in all respects to first feedback amplifier circuit D and will also invert the signal applied at S2 three times.

The dither portion of the signal applied L2 is inverted four times before application to coil L2; once in operational amplifier B2 and three times in feedback amplifier E. The dither signal at L2 is therefore in phase with the original dither signal at point X and 180° out of phase with the dither signal at coil L1.

Figure 4:
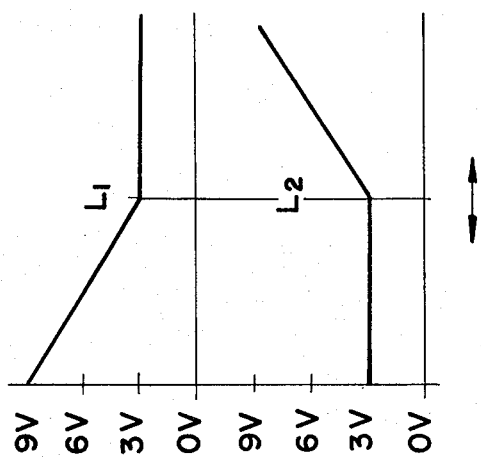
FIG. 4 is a representation of the voltage of the signals produced by the circuit of FIG. 1 at coils L1 and L2 for various inputs selected at Potentiometer P1.

The coil energization currents at L1 and L2 are shown in FIGS. 4 and 5. FIG. 4 shows the voltage applied to coils L1 and L2 by the actions of this circuit as set by potentiometer P1. A base voltage of approximately 3 volts is always applied to each coil regardless of potentiometer position. As the potentiometer wiper position varies from center, one or the other of the coils L1 and L2 is energized with a linearly increasing voltage level which reaches a maximum of 9 volts in both directions.

Superimposed on the voltage levels on L1 and L2 are dither signals as illustrated in FIG. 5. The two dither signals are out of phase. When a pulse is applied to L1 no pulse is present on L2 and vice versa. The two signals are applied to two separate coils L1 and L2 superimposed over the voltage levels on these coils selected by P1 wiper position.

The two coils L1 and L2 act upon a single magnetically controlled body F by the force of the magnetic field generated in the interior of each coil. The body F is spring biased into a rest position and magnetically urged to move in one direction in proportion to increasing current on coil L1 and to move in the axially opposite direction in response to current in coil L2. This is achieved by orienting the coils so that the polarity of the magnetic flux induced by the current in the two coils is opposing.

Because of the polarity of the coils, the magnetic flux induced by the two out of phase dither signals appears as a pulse of flux urging movement of body F in one direction induced by L1 followed by a pulse of flux urging movement of body F in the opposite direction induced by L2. The opposing pulses are always alternately applied to the two coils regardless of control wiper position.

Power Supply and Dither Circuit

Figure 2:
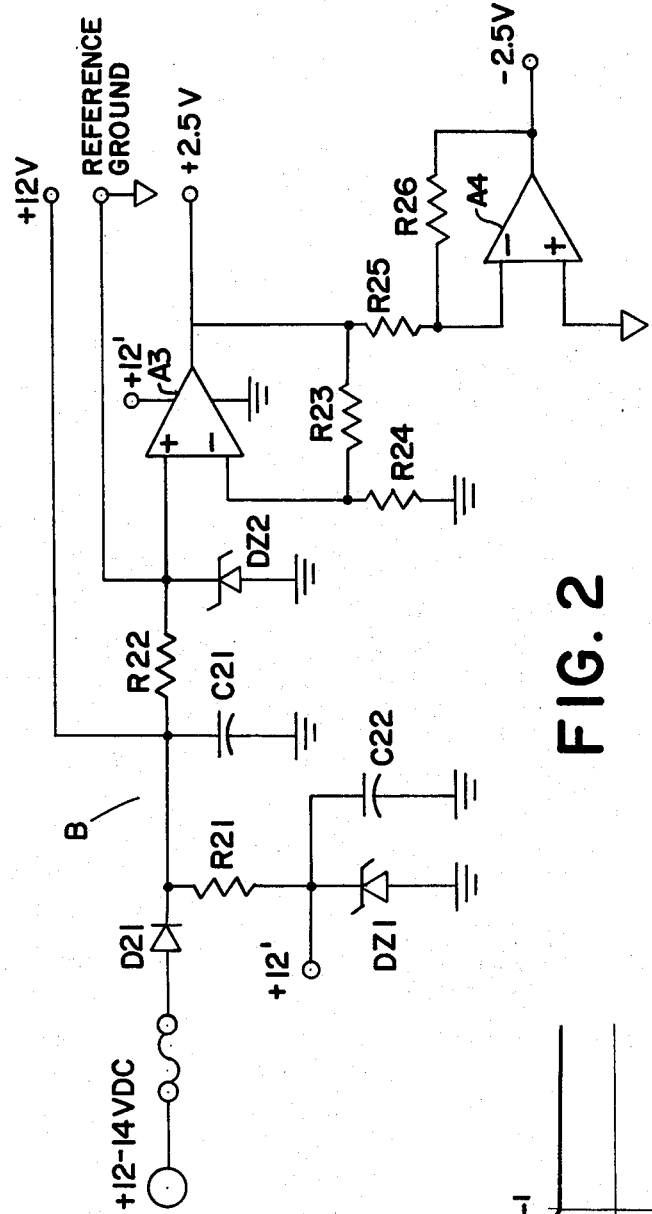
FIG. 2 is a schematic of the power supply providing appropriate power, reference ground and reference voltages for the control circuit of FIG. 1.

FIGS. 2 and 3 show schematically the power supply and dither circuit which provide necessary inputs to the control circuitry thus far described. The power supply shown in FIG. 2 is conventional and will not be described further except to set forth component values.

FIG. 3 shows operational amplifier B4 which is configured as an astable multi-vibrator or oscillator. The circuit has both positive and negative feedback through resistors R31 and R32, input from the reference ground through input resistor R33 and timing input to the inverting input from capacitor C31. This astable multi-vibrator configuration is conventional and results in a square wave dither frequency of approximately 50 to 100 hertz for the element values given. The output of this oscillator passes through resistor R34 and is clamped to maximum and minimum output values by diodes D31 and D32 connected to the −2.5 reference level, the output point and the +2.5 volt reference level respectively. The square wave output is made available at point X for use throughout the circuit.

| Component Values | | | |
|---|---|---|---|
| RESISTORS OHMS | | RESISTORS OHMS | |
| R1 | 22K | R14 | 20K |
| R2 | 866K | R15 | 33K |
| R3 | 33K | R16 | 28K |
| R4 | 28K | R21 | 47 (0.5 watt) |
| R5 | Optional | R22 | 1K (0.5 watt) |
| R6 | 2.2K | R23 | 16.5K |
| R7 | 150 (1 watt) | R24 | 30.9K |
| R8 | 20K | R25 | 20K |
| R9 | 470 | R26 | 20K |
| R10 | 39 | R31 | 330K |
| R11 | 220 (0.5 watt) | R32 | 560K |
| R12 | 20K | R33 | 150K |
| R13 | 82K | R34 | 3.3K |
| CAPACITORS MICROFARADS | | DIODES | |
| C1 | 1.0 | D21 MR500 | |
| C2 | 2.2 | D3,D103 IN 4001 | |
| C21 | 22 (50v) | All others IN 4148 | |
| C22 | 10 | | |
| C31 | 0.022 | ZENER DIODES | |
| | | DZ1 IN 4749A (24v) | |
| | | DZ2 IN 4732 (4.7V) | |
| TRANSISTORS | | INTEGRATED CIRCUIT | |
| T1 & T101 MPS-A05 | | Operational amplifiers A & B | |
| T2 & T102 TIP 42A | | LM2902 (four to a pkg.) | |

The invention has been described with reference to a preferred embodiment. Obviously, modifications and alterations will occur to others upon a reading and understanding of this specification. It is my intention to include such modifications and alterations insofar as they come within the scope of the appended claims.

Having thus described my invention, I claim:

1. A D.C. power source for energizing two coils acting on a single magnetically controlled element comprising means for producing an energizing voltage selectively variable for each of said coils varying from a predetermined minimum value to a maximum value with a polarity such that the flux of each coil is opposite from the other; means for superimposing a dither signal on each energizing voltage having a maximum value approaching said predetermined minimum value, the dither signal for one coil being 180° out of phase with the dither signal for the other coil.

2. The power source of claim 1 wherein said means for producing an energizing voltage comprises signal divider means having a single input and first and second outputs, said first output voltage varying in response to input values above a preselected division value and a fixed output voltage in response to input values below said preselected division value, said second output voltage varying in response to input values below a preselected division value and a fixed output voltage in response to input values above said preselected division value.

3. The power source of claim 2 wherein said dither signal is superimposed on said first and second outputs of said means for producing an energizing voltage and one of said first or second outputs having said dither signal imposed thereon is inverted.

4. A control circuit producing current for first and second magnetic coils acting on a single magnetically controlled element comprising means producing first and second independently variable control signals; means applying said first independently variable control signal to said first coil; means applying said second independently variable control signal to said second coil; means creating an alternating dither signal having a given peak to peak potential; first adder means adding said dither signal to said first independently variable control signal producing a first added signal; second adder means adding said dither signal to said second independently variable control signal such that said dither signal portion of said second added signal is out of phase with said dither signal portion of said first added signal; means applying said first added signal to said first magnetic coil; and, means applying said second added signal to said second magnetic coils.

5. The control circuit of claim 4 wherein said first and second independently variable control signals vary in response to a single input.

6. The circuit of claim 5 wherein said first and second independently variable control signals vary between a fixed base potential and a preselected maximum potential, one or the other of said independently variable control signal always having said fixed base potential.

7. The control circuit of claim 6 wherein said fixed base potential is approximately equal to the peak to peak potential of said dither signal portions.

* * * * *